United States Patent [19]

Hidman et al.

[11] Patent Number: 4,644,379
[45] Date of Patent: Feb. 17, 1987

[54] SEMICONDUCTOR COMPONENT FOR GENERATION OF OPTICAL RADIATION

[75] Inventors: Tomas Hidman; Christer Ovren, both of Västerås, Sweden

[73] Assignee: ASEA Aktiebolag, Västerås, Sweden

[21] Appl. No.: 677,952

[22] Filed: Dec. 4, 1984

[30] Foreign Application Priority Data

Dec. 8, 1983 [SE] Sweden .............................. 8306780

[51] Int. Cl.$^4$ ........................ H01L 33/00; H01S 3/19
[52] U.S. Cl. ...................................... 357/17; 357/16; 357/55; 372/45
[58] Field of Search ................ 357/17, 16, 55; 372/45

[56] References Cited

U.S. PATENT DOCUMENTS

| | | | |
|---|---|---|---|
| 3,476,993 | 11/1969 | Aldrich et al. | 357/38 |
| 3,968,564 | 7/1976 | Springthorpe | 357/17 |
| 4,386,429 | 5/1983 | Anthony | 357/17 |
| 4,408,331 | 10/1983 | Hartman et al. | 357/17 |

FOREIGN PATENT DOCUMENTS 0052886 3/1983 Japan ...................... 357/17

OTHER PUBLICATIONS

Grothe et al., "A High Speed InGaAsP Luminescent Diode", Conference: Proceedings of the Optical Communication Conference, Sep. 17-19, 1979, pp. 16.4-1-16.4-4.

*Primary Examiner*—William L. Sikes
*Assistant Examiner*—Georgia Y. Epps
*Attorney, Agent, or Firm*—Pollock, Vande Sande & Priddy

[57] ABSTRACT

A semiconductor component for electrical generation of optical radiation, for example an LED, is provided. The component includes a semiconductor body that contains a first region of material of a first conductivity, a second region of material of a second conductivity type adjacent to the first region; and a PN junction between these regions. The first region has a central part of a material with a first band gap and a peripheral part laterally surrounding the central part of the first region. The material of the peripheral part has a band gap larger than the bang gap of the central part of the first region. The material of the second region has a larger band gap than the band gap of the central part of the first region.

10 Claims, 4 Drawing Figures

SEMICONDUCTOR COMPONENT FOR GENERATION OF OPTICAL RADIATION

BACKGROUND OF THE INVENTION

This invention relates to a semiconductor component for the generation of optical radiation and with a region of p-type material, a region of n-type material and a p-n junction between the said regions, the p-n junction having a radiation-emitting active portion.

Generally speaking, light-emitting diodes (LEDs) are used for transforming electrical energy into optical energy. A normal operating current for an LED is 10–100 mA. At these current intensities, the efficiency of hitherto designed components, generally speaking, is high. For infrared emitting structures an internal quantum efficiency in the range of 80–90% is not unusual in commercially available LEDs. However, at low currents through the diode, for example 10 μA, the quantum efficiency drops drastically and is often at permillage level. The reason for the poor efficiency of these low currents, is that the charge transport through the component is dominated by current along the surface of the component, which does not give rise to any light emission.

In many applications, however, it could be very important to be able to use light-emitting components which have a high efficiency at low currents. One example of such an application is a fiber optic measuring system, in which energising power to operate a measuring transducer is only supplied thereto via optical fibers. The measuring signal from such a measuring transducer is usually transmitted back through the fiber system by means of an optical signal generated, for example, by an LED. For driving such an LED, only limited power is available and the total performace of the system is often determined by the efficiency of the LED. An example of this type of application is given in published European patent application No. 0 041 668.

One further example of the usefulness of a component with the performance mentioned above is two-way optical communication between stations via fibers, where one station has no other power supply than that supplied optically via the fiber. Such a system is proposed, in part, in the publication "The Bell System Technical Journal", vol. 57, No. 11, November 1978, page 3309.

SUMMARY OF THE INVENTION

The present invention relates to a semiconductor component for the electrical generation of optical radiation when electrically energized. The semiconductor component includes a semiconductor body that comprises a first region of material of a first conductivity; a second region of material of a second conductivity type adjacent to the first region; and a PN junction between these regions. The PN junction has a central part. The first region has a central part of a material with a first band gap and a peripheral part laterally surrounding the central part of the first region. The material of the peripheral part has a band gap larger than the band gap of the central part of the first region. The material of the second region has a larger band gap than the band gap of the central part of the first region.

The invention therefore provides a method of solving the above-mentioned problems and describes a general method of designing LEDs with a high efficiency for generating optical energy at small operating currents.

The method comprises arranging the region where the active region of the component intersects the surface of the component with a larger band gap then where the light emission takes place.

BRIEF DESCRIPTION OF THE DRAWING

The invention will now be described in greater detail, by way of example, with reference to the accompanying FIGS. 1–4, wherein.

DESCRIPTION OF PRIOR ART COMPONENT

Figure 1:
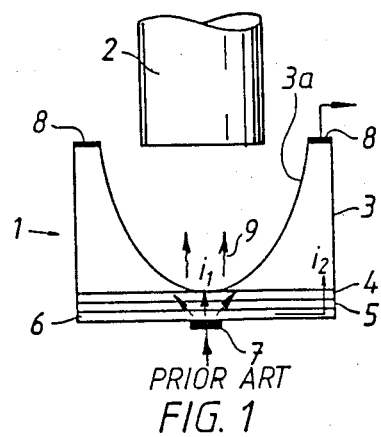
FIG. 1 shows a prior art component of the kind referred to here.

FIG. 1 illustrates the prior art and shows an LED 1, optically coupled to one end of a fiber 2. The LED is built up on an n-type body material 3 on which are provided a number of epitaxial layers 4 of n-type material and layers 5 and 6 of p-type material. The body material 3 is etched at 3a to provide a narrow region consisting substantially only of the layers 4, 5 and 6. Through a first metal contact 7, in the vicinity of the narrow region, current is driven through the component towards a second metal contact 8. Part of this current, $i_1$, passes through the p-n junction in the narrow region (i.e. in close proximity to the first contact 7). This part of the current causes—with high efficiency—optical radiation 9 which is coupled into the fiber 2. Part of the current $i_2$, however, passes in the planes of the layers 4, 5, 6 out towards the outer edges of the body material so that its passage across the p-n junction does not give rise to any efficient generation of optical radiation.

DESCRIPTION OF PREFERRED EMBODIMENTS

Figure 2:
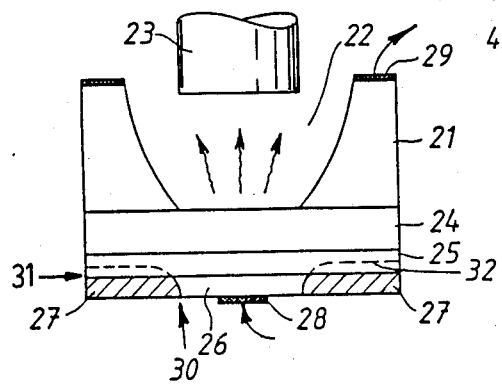
FIG. 2 and FIG. 3 show, respectively, a sectional side elevation and a plan from below of one embodiment of a component according to the invention.
Figure 3:
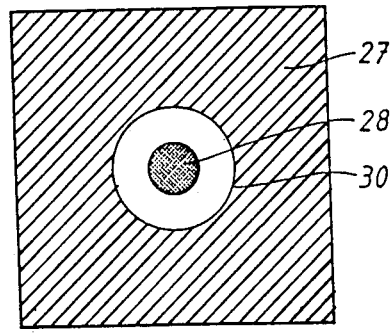

FIG. 2 and FIG. 3 illustrate an embodiment of device according to the invention. FIG. 2 shows a side section of the component, whereas FIG. 3 shows the component seen towards the surface shown as the lower surface in FIG. 2. 21 is a body material of GaAs, in which a hole 22 has been etched away, 23 is an end of an optical fiber, 24 is an epitaxially grown p-type $Al_xGa_{1-x}As$ layer, 25 is a p-type GaAs layer, 26 is an n-type $Al_xGa_{1-x}As$ layer. 27 denotes a region (cross hatched in FIGS. 2 and 3) which has been converted to p-type, for example by diffusion of Zn atoms into the material. As p-type doping impurity for the region 27 there may be used, as an alternative to Zn, a substance from the group Cd, Hg, Be, Mg, Si, Ge, Sn. 28 and 29 are ohmic contacts. By the diffusion which produces the p-type region 27 in the n-type layer 26, a boundary 30 is formed between p-doped and n-doped material which intersects the lower surface of the component along a circular line. Thus, a p-n junction is achieved between two regions 26, 27 of the $Al_xGa_{1-x}As$ material at the surface. Without the diffusion, the line of the intersection between the p-n junction and the surface of the component would lie at 31. In this latter case, a p-n junction between GaAs and $Al_xGa_{1-x}As$ would be obtained, that is, a heterojunction at the surface of the component. It is well known that the magnitude of the current which travels along the surface of the component is very heavily dependent on the band gap of the material. Since $Al_xGa_{1-x}As$ may be arranged to have a considerably larger band gap than GaAs, in a component according to the invention, the surface current will be considerably reduced compared with prior art designs. This results in a significant improvement in the efficiency for light generation particularly at low current densities.

By choosing a sufficiently high conductivity in the different layers of the semiconductor component, the series resistance of the component may be kept low, which results in the necessary supply power becoming low. This applies particularly to the layers 25 and 26. Preferably, the conductivity of the layer 26, at its surface, should be greater than 0.1 Siemens per meter, which corresponds to an impurity concentration which is higher than approximately $2.10^{16}$ cm$^{-3}$.

It should be understood that the diffusion which caused the creation of the boundary 30 and the region 27 extends over the entire thickness of outer regions of the layer 26 and into the layer 25 as is shown by the dashed line extension 32 of the boundary 30.

Figure 4:
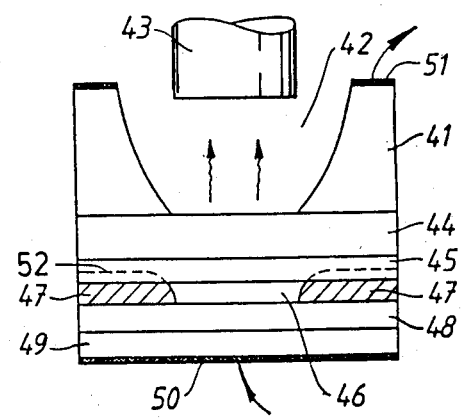
FIG. 4 shows, in sectional side elevation, an alternative embodiment.

An alternative embodiment is shown sectioned in FIG. 4. 41 is the base material in which a hole 42 has been etched away. 43 is an end of an optical fiber, 44 is an epitaxial p-type $Al_xGa_{1-x}As$ layer, 45 is a p-type GaAs layer, 46 is an n-type $Al_xGa_{1-x}As$ layer. 47 denotes a region which has been converted into p-type, for example by diffusion of Zn atoms through outer regions of the layer 46. Layer 48, which is of n-type $Al_xGa_{1-x}As$, and layer 49, which is of n-type GaAs, have been grown epitaxially after the Zn diffusion has occurred. The material in the layer 48 ($Al_xGa_{1-x}As$) has a larger band gap than GaAs. Since the layer 49 is of GaAs, a possibility of good electrical contact to the layer is provided and in FIG. 4 this contact is effected with a metal contact 50. The counter contact for the electrical energising voltage of the component is shown at 51. The Zn diffusion, which completely surrounds a non-diffused region of the layer 46, passes through the entire depth of the layer 46 and partly into edge regions of the layer 45 as can be seen by the dashed line 52 in FIG. 4. In this way a p-n junction is provided, the n-side of which consists of $Al_xGa_{1-x}As$ and the p-side of which consists of GaAs in the light-emitting region and of $Al_xGa_{1-x}As$ in that part which borders on the physical surface of the component. This component exhibits the same advantages as the component described with reference to FIGS. 2 and 3. In addition, the component according to FIG. 4 has an important further advantage that its active part, that is, the region at the junction between the layer 45 and the central part of the layer 46, is located at a greater distance from the surface, shown as the lower surface in the Figure, than is the case with the component shown in FIG. 2. Therefore, the active part is influenced to a lesser extent by atoms diffusing from the lower surface, for example from the metal contact 50, and the life of the component is therefore higher. Furthermore, the active part is less influenced by mechanical stresses, if any, in the surface and more simple mounting of the component becomes possible.

Many modifications are possible to the structures shown in FIGS. 2 to 4 without affecting their mode of operation and all such modifications within the spirit and scope of the following claims fall within the ambit of this invention. Thus a light-emitting component can be designed in many different ways within the scope of the invention, particularly as regards the manufacturing method. For instance, the material of said first region may be $In_xGa_{1-x}As_yP_{1-y}$.

What is claimed is:

1. In a semiconductor component for the generation of optical radiation when electrically energized, which component comprises a semiconductor body with:
    a first region of material of a first conductivity type;
    a second region of material of a second conductivity type adjacent said first region;
    a PN junction between said first and second regions;
    said PN junction having a central part;
    contact means for supplying a current to said component;
    means for restricting current flow through the component to said central part of said PN junction;
    wherein the first region has a central part of a material with a first band gap and a peripheral part laterally surrounding said central part of said first region, the material of said peripheral part having a band gap larger than said first band gap, and the material of said second region having a larger band gap than said first band gap.

2. A semiconductor component according to claim 1, having a first layer of a material with said first band gap and of said first conductivity type, and a second layer adjacent to said first layer, and of a material with a higher band gap than said first band gap; said second layer having a central part of said second conductivity type and a peripheral part of said first conductivity type; the peripheral part of said second layer laterally surrounding the central part of said second layer and comprising the entire thickness of said second layer.

3. A semiconductor component according to claim 1 in which said first conductivity type is p-type and second conductivity type is n-type.

4. A semiconductor component according to claim 2 in which said second layer is adjacent to a surface of said semiconductor body, the central part of the second layer being provided with a contact for the supply of energizing current to the component.

5. A semiconductor component according to claim 2 in which a third layer of material of said second conductivity type and with a band gap larger than said first band gap is arranged adjacent to and substantially coextensive with said second layer.

6. A semiconductor component according to claim 2 in which said semiconductor material is selected from $Al_xGa_{1-x}As$ and $In_xGa_{1-x}As_yP_{1-y}$.

7. A semiconductor component according to claim 2 in which the peripheral part of said second layer is created by diffusing a doping impurity into the peripheral part of the layer, converting the entire thickness of the layer from said second to said first conductivity type.

8. The semiconductor component according to claim 2 in which said semiconductor material is $Al_xGa_{1-x}As$.

9. The semiconductor component according to claim 7 wherein said impurity is selected from the group of Zn, Cd, Hg, Be, Mg, Si, Ge, and Sn.

10. The semiconductor component according to claim 7 wherein said impurity is Zn.

* * * * *